United States Patent
Xue et al.

(10) Patent No.: US 9,880,407 B2
(45) Date of Patent: Jan. 30, 2018

(54) TEST FIXTURE FOR ELECTRICAL FUNCTION TEST OF PRODUCT TO BE TESTED

(71) Applicants: Boe Technology Group Co., Ltd., Beijing (CN); Boe (Hebei) Mobile Display Technology Co., Ltd., Hebei (CN)

(72) Inventors: Liwei Xue, Beijing (CN); Jian Li, Beijing (CN); Dechao Wang, Beijing (CN)

(73) Assignees: BOE TECHNOLOGY GROUP CO., LTD., Beijing (CN); BOE (HEBEI) MOBILE DISPLAY TECHNOLOGY CO., LTD., Hebei (CN)

(*) Notice: Subject to any disclaimer, the term of this patent is extended or adjusted under 35 U.S.C. 154(b) by 97 days.

(21) Appl. No.: 14/767,956

(22) PCT Filed: Mar. 25, 2015

(86) PCT No.: PCT/CN2015/075013
§ 371 (c)(1),
(2) Date: Aug. 14, 2015

(87) PCT Pub. No.: WO2016/078279
PCT Pub. Date: May 26, 2016

(65) Prior Publication Data
US 2016/0334653 A1 Nov. 17, 2016

(30) Foreign Application Priority Data
Nov. 21, 2014 (CN) .......................... 2014 1 0677737

(51) Int. Cl.
*G01R 31/06* (2006.01)
*G02F 1/13* (2006.01)
(Continued)

(52) U.S. Cl.
CPC ......... *G02F 1/1309* (2013.01); *G01R 1/0408* (2013.01); *G01R 31/2808* (2013.01)

(58) Field of Classification Search
CPC ...... G02B 5/30; G02B 6/0088; G02B 6/0095; G02B 1/04; G02B 5/0242; G02B 6/0053;
(Continued)

(56) References Cited

U.S. PATENT DOCUMENTS 4,352,061 A * 9/1982 Matrone ............ G01R 1/07371
324/754.14
5,994,916 A 11/1999 Hayashi
(Continued)

FOREIGN PATENT DOCUMENTS

CN 1540359 10/2004
CN 2849764 12/2006
(Continued)

OTHER PUBLICATIONS

International Search Report and Written Opinion from PCT/CN15/87691 dated Dec. 21, 2015.
(Continued)

*Primary Examiner* — Vinh Nguyen
(74) *Attorney, Agent, or Firm* — Calfee, Halter & Griswold LLP

(57) ABSTRACT

A testing fixture includes a base, a signal source, a workstation and a crimping mechanism. The base is provided with a sloping surface carrying the workstation and the crimping mechanism. The signal source is located on the base. The crimping mechanism applies testing signals transmitted by the signal source to the product to be tested. Additionally, the workstation performs an electrical function test on the product to be tested. The testing fixture can effectively perform an electrical function test on the product to be tested and has an integrated design of the base, the
(Continued)

signal source, the workstation and the crimping mechanism, which facilitates management and maintenance. The base is also provided with a sloping surface carrying the workstation and the crimping mechanism to provide the testing fixture with an optimal testing angle, thereby facilitating operation and production.

13 Claims, 7 Drawing Sheets

(51) Int. Cl.
*G01R 1/04* (2006.01)
*G01R 31/28* (2006.01)

(58) Field of Classification Search
CPC .... G02B 5/045; G02B 6/0038; G02B 6/0065; G02B 5/0268; G02B 6/0036; G02B 1/002; G02B 5/00; G02B 5/0278; G02B 5/0284; G02B 6/0018; G02B 6/0028; G02B 6/0043; G02B 6/006; G02B 6/0075; G02B 6/0081; G02B 6/0085; G02B 27/286; G02B 5/02; G02B 5/021; G02B 5/0247; G02B 5/08; G02B 5/3083; G02B 6/002; G02B 6/0035; G02B 6/005; G02B 6/0055; G02B 6/0061; G02B 6/0073; G02B 6/0083; G02B 6/0091; G02F 1/1309; G02F 2001/133607; G02F 1/133308; G02F 1/133615; G02F 1/1335; G02F 2001/133507; G02F 2203/62; G02F 2001/136254; G02F 1/1345; G02F 1/13452; G02F 2001/133612; G02F 1/133504; G02F 2001/133314; G02F 1/133528; G02F 1/1336; G02F 1/133602; G02F 1/133524; G02F 1/133606; G02F 1/13363; G02F 1/133604; G02F 1/133605; G02F 1/133608; G02F 2001/133328; G02F 2201/58; G06T 15/50; G01R 1/0408; G01R 31/2808; G01R 31/2891; G01N 21/274; G01N 21/21; G01N 21/55; G01N 21/6486; G01N 21/8806; G01N 21/95; G01N 2201/062

See application file for complete search history.

(56) References Cited

U.S. PATENT DOCUMENTS 7,411,410 B2 * 8/2008 Kang .................. G02F 1/1309
324/756.07
2013/0050130 A1 2/2013 Brown

FOREIGN PATENT DOCUMENTS

| CN | 201654377 | 11/2010 |
| CN | 101995672 | 3/2011 |
| CN | 201909917 | 7/2011 |
| CN | 201956041 | 8/2011 |
| CN | 103677412 | 3/2014 |
| CN | 104123039 | 10/2014 |
| CN | 104407760 | 3/2015 |
| CN | 104461201 | 3/2015 |
| CN | 104516132 | 4/2015 |
| CN | 204347383 | 5/2015 |
| CN | 104699307 | 6/2015 |

OTHER PUBLICATIONS

International Search Report and Written Opinion from PCT/CN15/075013 dated Jun. 15, 2015 with English translation.
Office Action from China Application No. 201510015234.8 dated Feb. 4, 2017.
Second Office Action for Chinese Patent Application No. 201510015234.8 dated Jul. 28, 2017.

* cited by examiner

… (1)

TEST FIXTURE FOR ELECTRICAL FUNCTION TEST OF PRODUCT TO BE TESTED

RELATED APPLICATIONS

The present application is the U.S. national phase entry of PCT/CN2015/075013, filed on Mar. 25, 2015, which claims the benefit of Chinese Patent Application No. 201410677737.7, filed on Nov. 22, 2014, the entire disclosures of which are incorporated herein by reference.

TECHNICAL FIELD

The present disclosure relates to the field of display technology, and particularly to a testing fixture, and more particularly a testing fixture that provides an optimal testing angle and can be easily installed and maintained.

BACKGROUND ART

At present, LCDs (Liquid Crystal Display) have been widely applied in production and living due to its technological advantages. In the production process of LCDs, it is often required to use an auxiliary tool in cooperation with a signal testing machine to conduct LCD tests. The auxiliary tool can provide a signal connection between LCDs and the signal testing machine, and connect testing points of a signal source to corresponding testing points of a product to be tested, so as to finish the testing of the product to be tested under a light-on state.

The current testing fixtures have many defects in application: firstly, the fixture itself and the signal source are separately arranged and must be connected by an external flat cable when in use. In this case, the entire apparatus is in disorder when in operation, which is bad to workshop operation and unified management; and generally speaking, the fixture is operated only on a horizontal surface during signal testing, which fails to provide a good testing angle and does not facilitate fast production. Secondly, a polarizer of the fixture is often directly attached to the surface of a workstation by an acrylic plate, which leads to low transmittance of the polarizer and severe scratches, and greatly increases replacement frequency and omission ratio. Meanwhile, the fixture workstation and a backlight module are often integrated into one piece, i.e., the backlight module is directed fastened to a backlight module slot on the back of the workstation, which renders it difficult to clean and maintain the backlight module; additionally, an installation end of a probe on a fixture indenter is not retractable, such that the indenter, when moving reciprocally, will make the non-testing points broken, thereby leading to unnecessary damages.

Due to the above shortcomings, it is required to provide a testing fixture that can perform an effective electrical function test on the product to be tested, facilitate integral operation, provide an optimal testing angle and is easy to be installed and maintained.

SUMMARY OF THE DISCLOSURE

The technical problem to be addressed by the present disclosure is to provide a testing fixture that can perform an effective electrical function test on the product to be tested, facilitate integral operation, provide an optimal testing angle and is easy to be installed and maintained.

To this end, the present disclosure provides a testing fixture, which comprises a base, a signal source, a workstation and a crimping mechanism, the base is provided with a sloping surface carrying the workstation and the crimping mechanism, the signal source is located on the base, the crimping mechanism applies testing signals transmitted by the signal source to the product to be tested, and the workstation performs a electrical function test on the product to be tested.

According to one aspect of the present disclosure, a turnover unit is arranged above the workstation with one side of the turnover unit rotatablely connected with the workstation; a backlight module installation plate is arranged below the workstation and is detachably connected with the workstation; the product to be tested is arranged on the workstation and between the turnover unit and the backlight module installation plate; and a first polarizer is fastened to the turnover unit; and a backlight source is fastened to the backlight module installation plate, and a second polarizer is fastened to the backlight source.

According to one aspect of the present disclosure, the turnover unit includes a turning frame, a hinge and a stationary plate, one side of the turning frame is installed onto the workstation by a hinge, and the stationary plate firmly clamps the first polarizer onto the turning frame by a dual-layered glass plate.

According to one aspect of the present disclosure, the backlight module installation plate is provided with a first positioning post, and the workstation is provided with an installation hole in which the first positioning post is located.

According to one aspect of the present disclosure, the workstation and the backlight module installation plate are connected by a magnetic component.

According to one aspect of the present disclosure, the workstation is provided with a fourth positioning post for limiting the position of the product to be tested.

According to one aspect of the present disclosure, a horizontal adjustment plate, a longitudinal adjustment plate and a bottom plate are sequentially arranged from top to bottom under the backlight module installation plate; the horizontal adjustment plate is provided with an installation slot of a circuit board for driving the backlight source; the bottom plate is fastened to the sloping surface, the longitudinal adjustment plate moves in a Y direction, and the horizontal adjustment plate moves in an X direction.

According to one aspect of the present disclosure, the horizontal adjustment plate is provided with a horizontal slot, and the longitudinal adjustment plate is provided with a second positioning post located in the horizontal slot; and the longitudinal adjustment plate is provided with a longitudinal slot, and the bottom plate is provided with a third positioning post located in the longitudinal slot.

According to one aspect of the present disclosure, the crimping mechanism comprises a driving unit and an indenter; the driving unit drives the indenter in motion in a Z direction; the indenter is provided at one end with a protrusion, through which a plurality of probes is provided; and the probe is electrically connected at one end with the signal source, and is contact-connected at the other end with the testing points of the product to be tested.

According to one aspect of the present disclosure, the driving unit comprises a frame, a rotary handle, an eccentric block, a supporting plate and an elastic component, the frame is located on the sloping surface, and a guiding shaft is provided in the frame; the elastic component and the supporting plate are sleeved onto the guiding shaft, and the elastic component is located under the supporting plate; the indenter is firmly connected to one side of the supporting plate, the eccentric block is located above the supporting plate, the rotary handle drives the eccentric block to be crimped onto the supporting plate, and the supporting plate moves along the axial direction of the guiding shaft under the action of the eccentric block.

According to one aspect of the present disclosure, the signal source is connected with a control key for switching testing signals transmitted by the signal source.

According to one aspect of the present disclosure, the signal source is fastened within the base by a signal source installation plate, and the control key is located on the side plate of the base.

According to one aspect of the present disclosure, the sloping surface has an angle ranging from 40° to 50° with respect to the horizontal surface.

The above technical solutions of the present disclosure have the following advantageous effects: the testing fixture of the present disclosure can effectively perform an electrical function test on the product to be tested and can be easily managed and maintained by an integral design of the base, the signal source, the workstation and the crimping mechanism, and the base is provided with a sloping surface carrying the workstation and the crimping mechanism to provide the testing fixture with an optimal testing angle, thereby facilitating operation and production.

REFERENCE SIGNS

Figure 1:
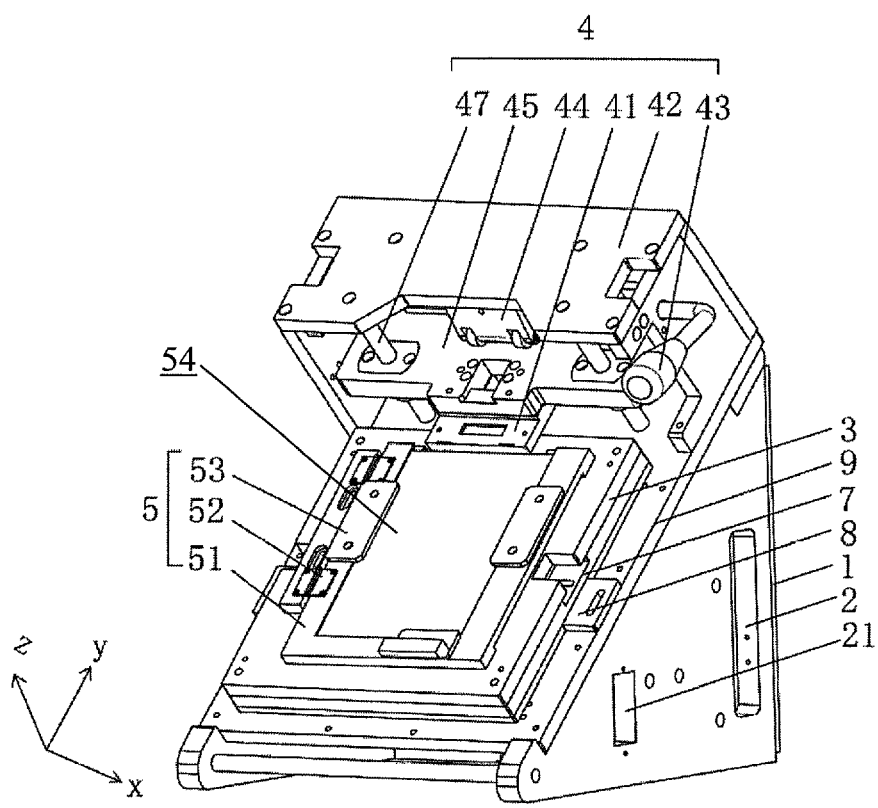
FIG. 1 is a perspective view of a testing fixture according to an embodiment of the present disclosure.

1—base; 2—signal source; 3—workstation; 4—crimping mechanism; 5—turnover unit; 6—backlight module installation plate; 7—horizontal adjustment plate; 8—longitudinal adjustment plate; 9—bottom plate; 11—first positioning post; 12—second positioning post; 13—third positioning post; 14—fourth positioning post; 21—control key; 22—signal source installation plate; 31—installation hole; 32—magnetic component; 33—positioning slot; 41—indenter; 42—frame; 43—rotary handle; 44—eccentric block; 45—supporting plate; 46—elastic component; 47—guiding shaft; 51—turning frame; 52—hinge; 53—stationary plate; 71—longitudinal slot; 72—driving circuit board installation slot; 81—longitudinal slot; 411—protrusion; 421—probe.

DETAILED DESCRIPTION OF THE DISCLOSURE

The embodiments of the present disclosure will be further described with reference to the drawings examples thereof. The following examples are intended to explain the disclosure, rather than limit the scope of the present disclosure.

In the depiction of the present disclosure, "a plurality of" means two or more; the oriental or positional relations indicated by the terms "up", "down", "left", "right", "internal", "external", "front end", "rear end", "head" and "tail", etc. are oriental or positional relations indicated in the drawings, which are just for easy and simple depiction of the present disclosure, instead of indicating or implying that the means or unit must have a particular orientation, or be configured or operated in a particular orientation. Thus, they cannot be understood as limitations to the present disclosure. Additionally, the terms "first", "second" and "third" are only for illustration, and should not be understood as an indication or implication of relative importance.

Furthermore, in the depiction of the present disclosure, the terms "install", "couple" and "connect" shall be understood in a broad sense, for instance, fixedly connected, detachably connected or integrally connected; or mechanically connected or electrically connected; or directly connected or connected by an intermediate media. A person ordinarily skilled in the art can understand the specific meanings of the terms in the present disclosure under particular circumstances.

As shown in FIG. 1, a testing fixture according to the present embodiment includes a base 1, a signal source 2, a workstation 3 and a crimping mechanism 4, the base 1 is provided with a sloping surface carrying the workstation 3 and the crimping mechanism 4, and the angle between the sloping surface and the horizontal surface can be flexibly adjusted as required, for instance, the angle can be from 40° to 50°, preferably 45°, so as to provide an optimal testing angle for an operator. Moreover, the signal source 2 is arranged on the base 1 so that the signal source 2 can directly form testing signals for testing the product to be tested, which facilitates integrated operation and management; additionally, the crimping mechanism 4 is arranged corresponding to one side of the workstation 3 to apply the testing signals transmitted by the signal source 2 to the product to be tested; meanwhile, the workstation 3 can be used to perform a electrical function test on the product to be tested after signal connection. The entire testing fixture can be operated integratedly, has an optimal testing angle, and is easy to be installed and maintained.

As shown in FIGS. 1, 4, 5 and 9, to simulate a light-on state, a turnover unit 5 is arranged above the workstation 3 and is rotatablely connected at one side with the workstation 3; a backlight module installation plate 6 is provided under the workstation 3 and is detachably connected with the workstation 3; the product to be tested is arranged on the workstation 3 and located between the turnover unit 5 and the backlight module installation plate 6, and a first polarizer 54 (upper polarizer) is fixed on the turnover unit 5 and above the product to be tested; a backlight source 62 is fixed on the backlight module installation plate 6, and a second polarizer 61 (lower polarizer) is fixed on the backlight source 62 and under the product to be tested. The backlight source 6 forms a stable light source that radiates lights on the product to be tested through hollow slots in the workstation 3.

To be specific, the turnover unit 5 comprises a turning frame 51, a hinge 52 and a stationary plate 53, the turning frame 51 is installed at one side on the workstation 3 by a hinge 52 which helps to achieve a turning function for the purpose of fast installation and maintenance; a slot for receiving the first polarizer 54 is provided on the inner side of the turning frame 51, and a stationary plate 53 firmly clamps the first polarizer 54 onto the turning frame 51 by a dual-layered glass plate, namely, the first polarizer 54, after being clamped by the dual-layered transparent glass plate, is installed in the slot of the turning frame 51 by the stationary plate 53. Clamping the polarizer 54 between the dual-layered white glass plates can completely prevent the risk of scratching the polarizer 54.

The backlight module installation plate 6 is detachably connected with the workstation 3. They cooperate with each other separately, which not only facilitates cleaning of the backlight module, but also keeps the upper surface of the backlight module closest to the product to be tested so as to achieve the best testing effect. Of course, there is a plurality of detachable connection manners, for instance, the backlight module installation plate 6 is provided with a first positioning post 11, the workstation 3 is provided with an installation hole 31, the first positioning post 11 is located within the installation hole 31; or the workstation 3 is connected with the backlight module installation plate 6 by a magnetic component 32 for mutual positioning by means of the magnetic force of the magnet. Of course, for further optimization, the positioning post and the magnetic component 32 cooperate in use for the sake of accurate positioning and installation.

Since the product to be tested is located on the workstation 3 during the electrical function test, the workstation 3 needs a means to accurately position the product to be tested, which is explained in one of the preferable manners: the workstation 3 is provided with a plurality of fourth positioning posts 14 which cooperate together to limit the position of the product to be tested. For protection of the product to be tested, the fourth positioning post 14 can be preferably made of a resin material.

As shown in FIGS. 1, 6, 7 and 8, a horizontal adjustment plate 7, a longitudinal adjustment plate 8 and a bottom plate 9 are sequentially arranged from top to bottom under the backlight module installation plate 6. The workstation 3 is adjusted for alignment in an X direction by the horizontal adjustment plate 7, and adjusted for alignment in a Y direction by the longitudinal adjustment plate 8. The workstation can be adjusted conveniently so as to achieve an increased testing efficiency.

The horizontal adjustment plate 7 is provided with an installation slot 72 of a driving circuit board, in which the circuit board for driving the backlight source 62 can be installed. The backlight module installation plate 6 and the horizontal adjustment plate 7 can be connected by a positioning post and a magnetic component 32. Meanwhile, the horizontal adjustment plate 7 can move in the X direction, namely, along the horizontal direction (left-right direction) of the sloping surface; the longitudinal adjustment plate 8 is located under the horizontal adjustment plate 7 and can move in the Y direction, namely, along the longitudinal direction (front-rear direction) of the sloping surface; and the bottom plate 9 is fastened to the sloping surface.

The horizontal adjustment plate 7 is provided with a horizontal sot 71 (parallel to the X direction), and the longitudinal adjustment plate 8 is provided with a second positioning post 12 that can be assembled into the horizontal slot 71. In use, it is only required that the horizontal slot 71 slides along the second positioning post 12. Correspondingly, the longitudinal adjustment plate 8 is provided with a longitudinal slot 81 (parallel to the Y direction), and the bottom plate 9 is provided with a third positioning post 13 that can be assembled into the longitudinal slot 81. In use, it is only required that the longitudinal slot 81 slides along the third positioning post 13.

What needs to be explained is that the aligning adjustment between the horizontal adjustment plate 7 and the longitudinal adjustment plate 8 is not limited to a particular manner and can be designed according to actual needs. During the aligning adjustment, in addition to such manners as chutes and positioning posts, slide blocks and slide rails are also applicable. So are pulleys and slideways.

Figure 2:
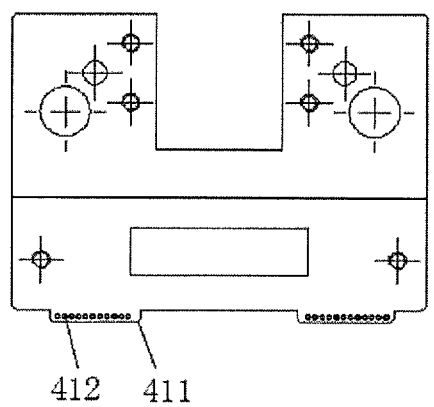
FIG. 2 is a structural schematic view of an indenter according to an embodiment of the present disclosure.
Figure 3:
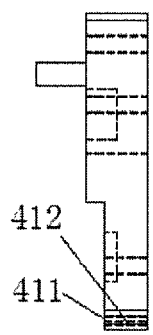
FIG. 3 is a side view of the indenter according to an embodiment of the present disclosure.
Figure 4:
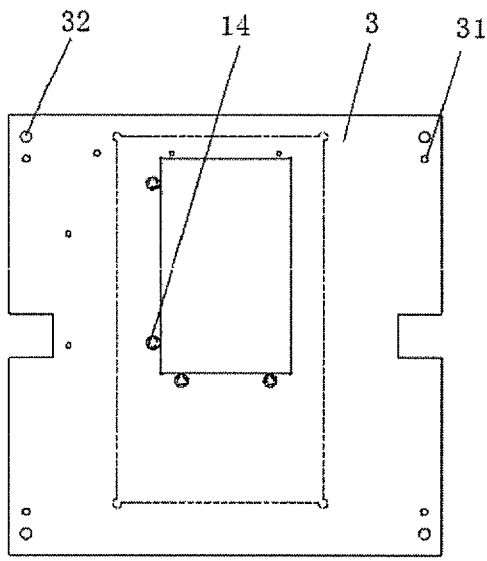
FIG. 4 is a structural schematic view of a workstation according to an embodiment of the present disclosure.
Figure 5:
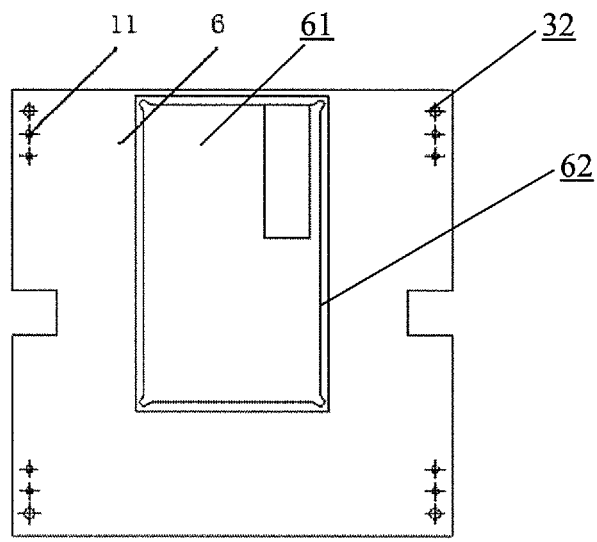
FIG. 5 is a structural schematic view of a backlight module installation plate according to an embodiment of the present disclosure.
Figure 6:
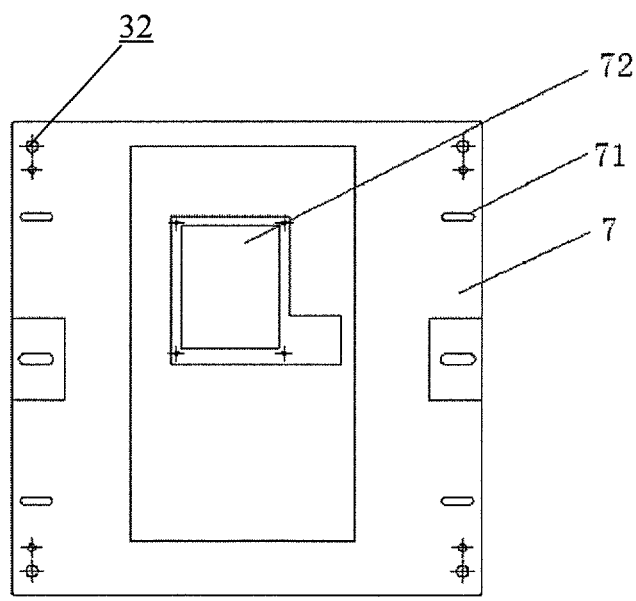
FIG. 6 is a structural schematic view of a horizontal adjustment plate according to an embodiment of the present disclosure.
Figure 7:
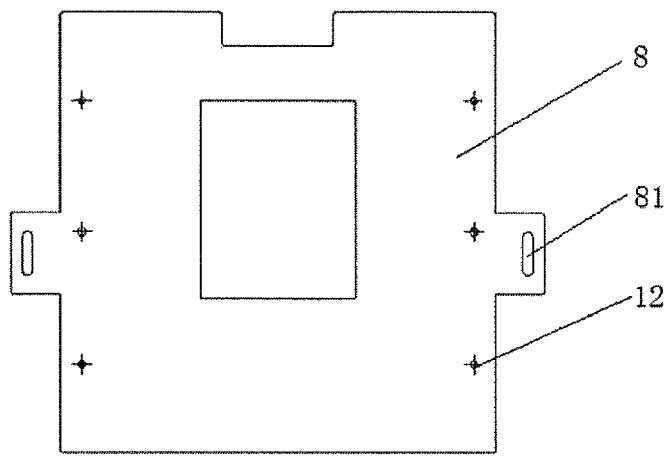
FIG. 7 is a structural schematic view of a longitudinal adjustment plate according to an embodiment of the present disclosure.
Figure 8:
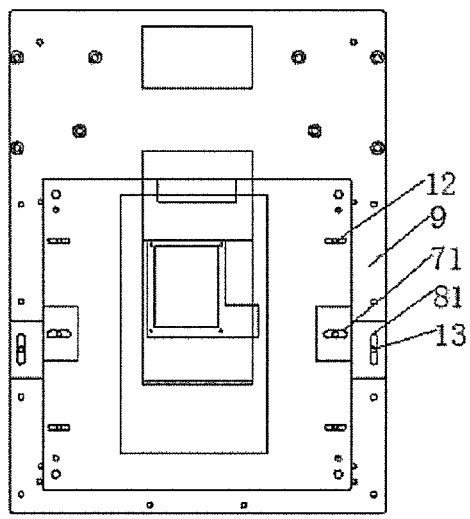
FIG. 8 is a schematic view of an assembled bottom plate according to an embodiment of the present disclosure.
Figure 9:
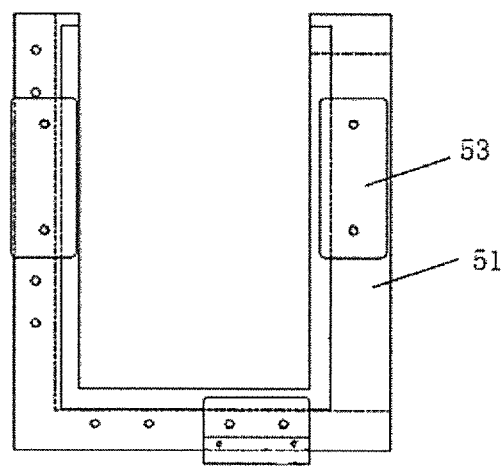
FIG. 9 is a structural schematic view of a turnover unit according to an embodiment of the present disclosure.
Figure 13:
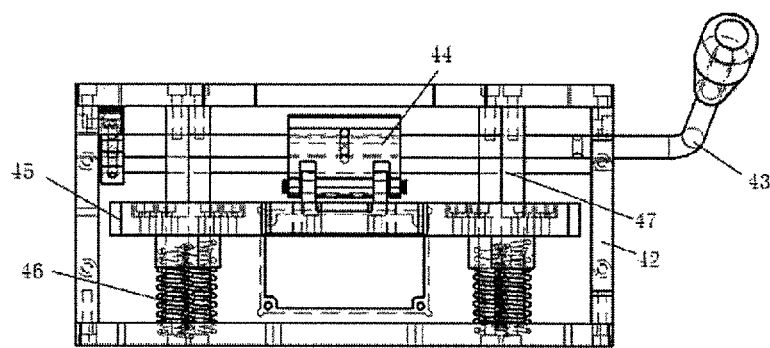
FIG. 13 is a structural schematic view of a crimping mechanism according to an embodiment of the present disclosure.

As for the crimping mechanism 4, as shown in FIGS. 2, 3 and 13, the crimping mechanism 4 comprises a driving unit and an indenter 41; the driving unit drives the indenter 41 in motion in the Z direction, namely perpendicular to the direction of the sloping surface; the indenter 41 is provided at one end with a protrusion 411, through which a plurality of probes 412 is provided. The indenter 41 is designed with the probes 412 partially projecting. Only the probes 412 are in direct contact with the testing points when testing the product, and the other portions of the indenter 41 are not in contact with the product surface, in such a way that the product to be tested can be prevented from damage and cracking.

The probe 412 is electrically connected at one end with the signal source 2, namely, a probe installation plate is cooperatively connected with the circuit board to which the testing signals correspond; meanwhile, the probe 412 is contact-connected at the other end with the testing points of the product to be tested during testing. The probe 412 is preferably double-headed and retractable. The double-headed and retractable probe 412 renders the two heads of the probe retractable by utilizing an intermediate sleeve in cooperation with a spring, such that the probe, when in contact with the product, has a buffering effect and will not damage the product as a result of over-high pressure.

Moreover, the driving unit can be either manually operated or electrically operated. Take one operation manner as an example for explanation: the driving unit comprises a frame 42, a rotary handle 43, an eccentric block 44, a supporting plate 45 and an elastic component 46; the frame 42 is located on the sloping surface and provided therein with a guiding shaft 47 that is perpendicular to the sloping surface; the elastic component 46 and the supporting plate 45 are sleeved onto the guiding shaft 47, and the elastic component 46 is located under the supporting plate 45 and can be a spring in consideration of the cost for the purpose of restoring the supporting plate 45; the indenter 41 is fixedly connected to one side of the supporting plate 45 and moves reciprocally together with the supporting plate 45; the eccentric block 44 is located above the supporting plate 45; the rotary handle 43 is used to drive the eccentric block 44 to be crimped onto the supported plate 45, so that the supporting plate 45 moves along the axial direction of the guiding shaft 47 under the action of the eccentric block 44.

Figure 10:
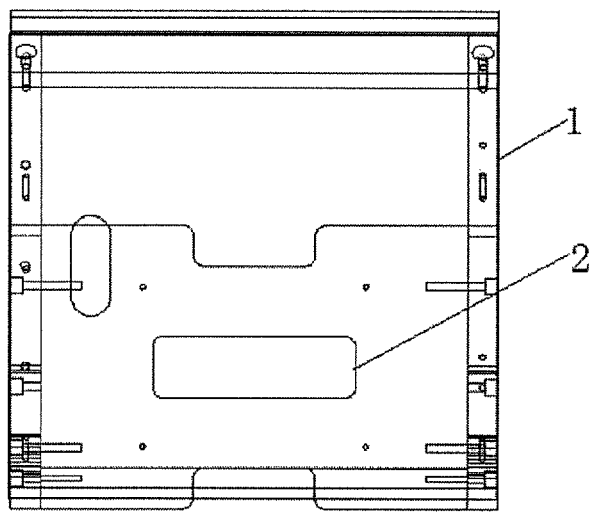
FIG. 10 is a structural schematic view of a base according to an embodiment of the present disclosure.
Figure 11:
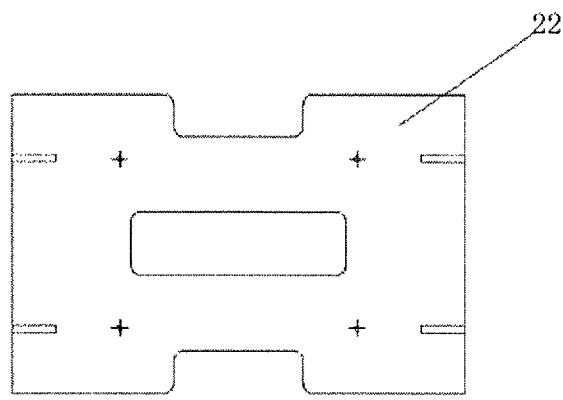
FIG. 11 is a structural schematic view of a signal source installation plate according to an embodiment of the present disclosure.
Figure 12:
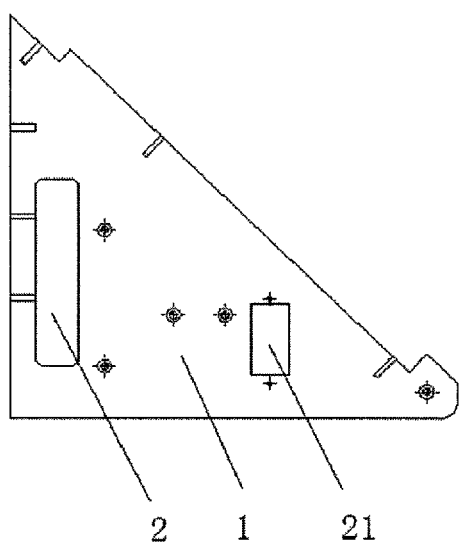
FIG. 12 is a side view of the base according to an embodiment of the present disclosure.

With reference to FIGS. 10, 11 and 12, the signal source 2 is also connected with a control key 21 used for controlling and switching the testing signals transmitted by the signal source. The signal source 2 is fastened within the base 1 by a signal source installation plate 22, and the control key 21 is located on the side plate of the base 1 for the sake of easy operation.

To be specific, the indenter 41 is connected with the signal source 2 by several rows of flat cables (for instance, 26 pin flat cable structure), and the testing signals are transmitted to each probe 412 of the indenter 41. The backlight source 62 provides a stable light source to the product to be tested, and the turnover unit 5 and the backlight source 6 are respectively provided with upper and lower polarizers 54, 61 for testing different-colored pictures of the products; the signal source 2 is connected with the control key by another flat cable structure (for instance, 2 pin flat cable), and the rotary handle 43 is pressed down to render the probe 412 in contact with the product to be testified to illuminate the product for detection.

In summary, the testing fixture of the present disclosure can effectively perform an electrical function test on the product to be tested and has an integrated design of a base, a signal source, a workstation and a crimping mechanism, which facilitates management and maintenance; and the base is also provided with a sloping surface carrying the workstation and the crimping mechanism to provide the testing fixture with an optimal testing angle, thereby facilitating operation and production.

The embodiments of the present disclosure are given for the sake of exemplification and depiction, rather than an exhausted list or to limit the present disclosure. Many modifications and variations are obvious to those skilled in the art. The embodiments are selected and described so as to better explain the principle and practical application of the present disclosure, and help a person ordinarily skilled in the art to understand the present disclosure and thereby design various embodiments with various modifications applicable to particular usages.

The invention claimed is:

1. A testing fixture, comprising: a base, a signal source, a workstation and a crimping mechanism, wherein the base is provided with a sloping surface carrying the workstation and the crimping mechanism, the signal source is located on the base, the crimping mechanism applies testing signals transmitted by the signal source to a product to be tested, and the workstation performs an electrical function test on the product to be tested, wherein a turnover unit is arranged above the workstation with one side of the turnover unit rotatably connected with the workstation.

2. The testing fixture according to claim 1, wherein a backlight module installation plate is arranged below the workstation and is detachably connected with the workstation; the product to be tested is arranged on the workstation and between the turnover unit and the backlight module installation plate; and a first polarizer is fastened to the turnover unit; and a backlight source is fastened to the backlight module installation plate, and a second polarizer is fastened to the backlight source.

3. The testing fixture according to claim 2, wherein the turnover unit includes a turning frame, a hinge and a stationary plate, one side of the turning frame is installed onto the workstation by a hinge, and the stationary plate firmly clamps the first polarizer onto the turning frame by a dual-layered glass plate.

4. The testing fixture according to claim 2, wherein the backlight module installation plate is provided with a first positioning post, and the workstation is provided with an installation hole in which the first positioning post is located.

5. The testing fixture according to claim 2, wherein the workstation and the backlight module installation plate are connected by a magnetic component.

6. The testing fixture according to claim 2, wherein the workstation is provided with a fourth positioning post for limiting a position of the product to be tested.

7. The testing fixture according to claim 2, wherein a horizontal adjustment plate, a longitudinal adjustment plate and a bottom plate are sequentially arranged from top to bottom under the backlight module installation plate; the horizontal adjustment plate is provided with an installation slot of a circuit board for driving the backlight source; the bottom plate is fastened to the sloping surface, the longitudinal adjustment plate moves in Y direction, and the horizontal adjustment plate moves in X direction.

8. The testing fixture according to claim 7, wherein the horizontal adjustment plate is provided with a horizontal slot, and the longitudinal adjustment plate is provided with a second positioning post located in the horizontal slot; and the longitudinal adjustment plate is provided with a longitudinal slot, and the bottom plate is provided with a third positioning post located in the longitudinal slot.

9. The testing fixture according to claim 1, wherein the crimping mechanism comprises a driving unit and an indenter; the driving unit drives the indenter in motion in Z direction; the indenter is provided at one end with a protrusion, through which a plurality of probes is provided; and the probe is electrically connected at one end with the signal source, and is contact-connected at the other end with a testing points of the product to be tested.

10. The testing fixture according to claim 9, wherein the driving unit comprises a frame, a rotary handle, an eccentric block, a supporting plate and an elastic component, the frame is located on the sloping surface, and a guiding shaft is provided in the frame; the elastic component and the supporting plate are sleeved onto the guiding shaft, and the elastic component is located under the supporting plate; the indenter is firmly connected to one side of the supporting plate, the eccentric block is located above the supporting plate, the rotary handle drives the eccentric block to be crimped onto the supporting plate, and the supporting plate moves along an axial direction of the guiding shaft under the action of the eccentric block.

11. The testing fixture according to claim 1, wherein the signal source is connected with a control key for switching testing signals transmitted by the signal source.

12. The testing fixture according to claim 11, wherein the signal source is fastened within the base by a signal source installation plate, and the control key is located on the side plate of the base.

13. The testing fixture according to claim 1, wherein the sloping surface has an angle ranging from 40° to 50° with respect to the horizontal surface.

* * * * *